US010790260B2

(12) United States Patent
Liu et al.

(10) Patent No.: US 10,790,260 B2
(45) Date of Patent: Sep. 29, 2020

(54) PLASMA ACTIVATION TREATMENT FOR WAFER BONDING

(71) Applicant: YANGTZE MEMORY TECHNOLOGIES CO., LTD., Wuhan (CN)

(72) Inventors: Mengyong Liu, Wuhan (CN); Tao Tao Ding, Wuhan (CN); Wu Liu, Wuhan (CN); Rui Yuan Xing, Wuhan (CN); Guoliang Chen, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/354,805

(22) Filed: Mar. 15, 2019

(65) Prior Publication Data

US 2020/0212004 A1 Jul. 2, 2020

Related U.S. Application Data

(63) Continuation of application No. PCT/CN2019/070143, filed on Jan. 2, 2019.

(51) Int. Cl.
*H01L 23/00* (2006.01)
*H01L 25/065* (2006.01)
(Continued)

(52) U.S. Cl.
CPC .............. *H01L 24/80* (2013.01); *H01L 24/08* (2013.01); *H01L 25/0657* (2013.01);
(Continued)

(58) Field of Classification Search
None
See application file for complete search history.

(56) References Cited

U.S. PATENT DOCUMENTS 5,383,993 A * 1/1995 Katada ................ H01L 21/2007 148/DIG. 12
5,421,953 A * 6/1995 Nagakubo ............... B29C 59/14 156/272.2

(Continued)

FOREIGN PATENT DOCUMENTS

CN 105197880 A 12/2015
CN 106571334 A 4/2017

(Continued)

OTHER PUBLICATIONS

International Search Report issued in corresponding International Application No. PCT/CN2019/070143, dated Oct. 10, 2019, 5 pages.

(Continued)

*Primary Examiner* — Steven M Christopher
(74) *Attorney, Agent, or Firm* — Bayes PLLC

(57) ABSTRACT

Embodiments of wafer bonding methods are disclosed. In an example, a first plasma activation treatment based on oxygen or an inert gas is performed on a front surface of a first wafer and a front surface of a second wafer. After the first plasma activation treatment, a second plasma activation treatment based on water molecules is performed on the front surface of the first wafer and the front surface of the second wafer. After the second plasma activation treatment, the first wafer and the second wafer are bonded such that the treated front surface of the first wafer is in physical contact with the treated front surface of the second wafer.

20 Claims, 7 Drawing Sheets

202
Si Si Si Si Si
OH OH OH OH OH
OH OH OH OH OH
Si Si Si Si Si
204
302
202
Si Si Si Si Si
O O O O O
Si Si Si Si Si
204
304

(51) Int. Cl.
*H01L 25/18* (2006.01)
*H01L 25/00* (2006.01)

(52) U.S. Cl.
CPC .............. *H01L 25/18* (2013.01); *H01L 25/50* (2013.01); *H01L 2224/08145* (2013.01); *H01L 2224/80013* (2013.01); *H01L 2224/80894* (2013.01); *H01L 2225/06524* (2013.01); *H01L 2225/06558* (2013.01); *H01L 2924/1431* (2013.01); *H01L 2924/14511* (2013.01)

(56) References Cited

U.S. PATENT DOCUMENTS

2006/0032582 A1* 2/2006 Chen ........................ H01L 24/83 156/272.6
2007/0111471 A1 5/2007 Okada
2014/0141560 A1 5/2014 Maekawa
2019/0051524 A1* 2/2019 Guo .................. H01L 21/02057
2020/0075444 A1* 3/2020 Luo ....................... H01L 23/481

FOREIGN PATENT DOCUMENTS

CN 107633997 A 1/2018
JP 2017079316 A 4/2017
TW 201436059 A 9/2014

OTHER PUBLICATIONS

Written Opinion of the International Searching Authority issued in corresponding International Application No. PCT/CN2019/070143, dated Oct. 10, 2019, 5 pages.

* cited by examiner

PLASMA ACTIVATION TREATMENT FOR WAFER BONDING

CROSS REFERENCE TO RELATED APPLICATION

This application is continuation of International Application No. PCT/CN2019/070143, filed on Jan. 2, 2019, entitled "PLASMA ACTIVATION TREATMENT FOR WAFER BONDING," which is hereby incorporated by reference in its entirety.

BACKGROUND

Embodiments of the present disclosure relate to wafer bonding methods.

Planar semiconductor devices, such as memory cells, are scaled to smaller sizes by improving process technology, circuit design, programming algorithm, and fabrication process. However, as feature sizes of the semiconductor devices approach a lower limit, planar process and fabrication techniques become challenging and costly. A three-dimensional (3D) device architecture can address the density limitation in some planar semiconductor devices, for example, Flash memory devices.

A 3D semiconductor device can be formed by stacking semiconductor wafers or dies and interconnecting them vertically using, for instance, through-silicon vias (TSVs) or copper-to-copper (Cu—Cu) connections, so that the resulting structure acts as a single device to achieve performance improvements at reduced power and smaller footprint than conventional planar processes. Among the various techniques for stacking semiconductor wafers, direct bonding, a process where two separate wafer surfaces are brought into physical contact and are bonded without any intermediate adhesives or external forces, is recognized as one of the promising techniques.

SUMMARY

Embodiments of wafer bonding methods are disclosed herein.

In one example, a method for wafer bonding is disclosed. A first plasma activation treatment based on oxygen or an inert gas is performed on a front surface of a first wafer and a front surface of a second wafer. After the first plasma activation treatment, a second plasma activation treatment based on water molecules is performed on the front surface of the first wafer and the front surface of the second wafer. After the second plasma activation treatment, the first wafer and the second wafer are bonded such that the treated front surface of the first wafer is in physical contact with the treated front surface of the second wafer.

In another example, a method for wafer bonding is disclosed. A plasma activation treatment based on water molecules is performed on a front surface of a first wafer and a front surface of a second wafer. The front surface of the first wafer and the front surface of the second wafer are free from another plasma activation treatment based on oxygen or an inert gas. After the plasma activation treatment, the first wafer and the second wafer are bonded such that the treated front surface of the first wafer is in physical contact with the treated front surface of the second wafer.

In still another example, a method for wafer bonding is disclosed. A plasma activation treatment is performed on a front surface of a first silicon wafer and a front surface of a second silicon wafer to form hydroxyl groups on the front surface of the first silicon wafer and the front surface of the second silicon wafer. After the plasma activation treatment, the first silicon wafer and the second silicon wafer are bonded such that the treated front surface of the first silicon wafer is in physical contact with the treated front surface of the second silicon wafer.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
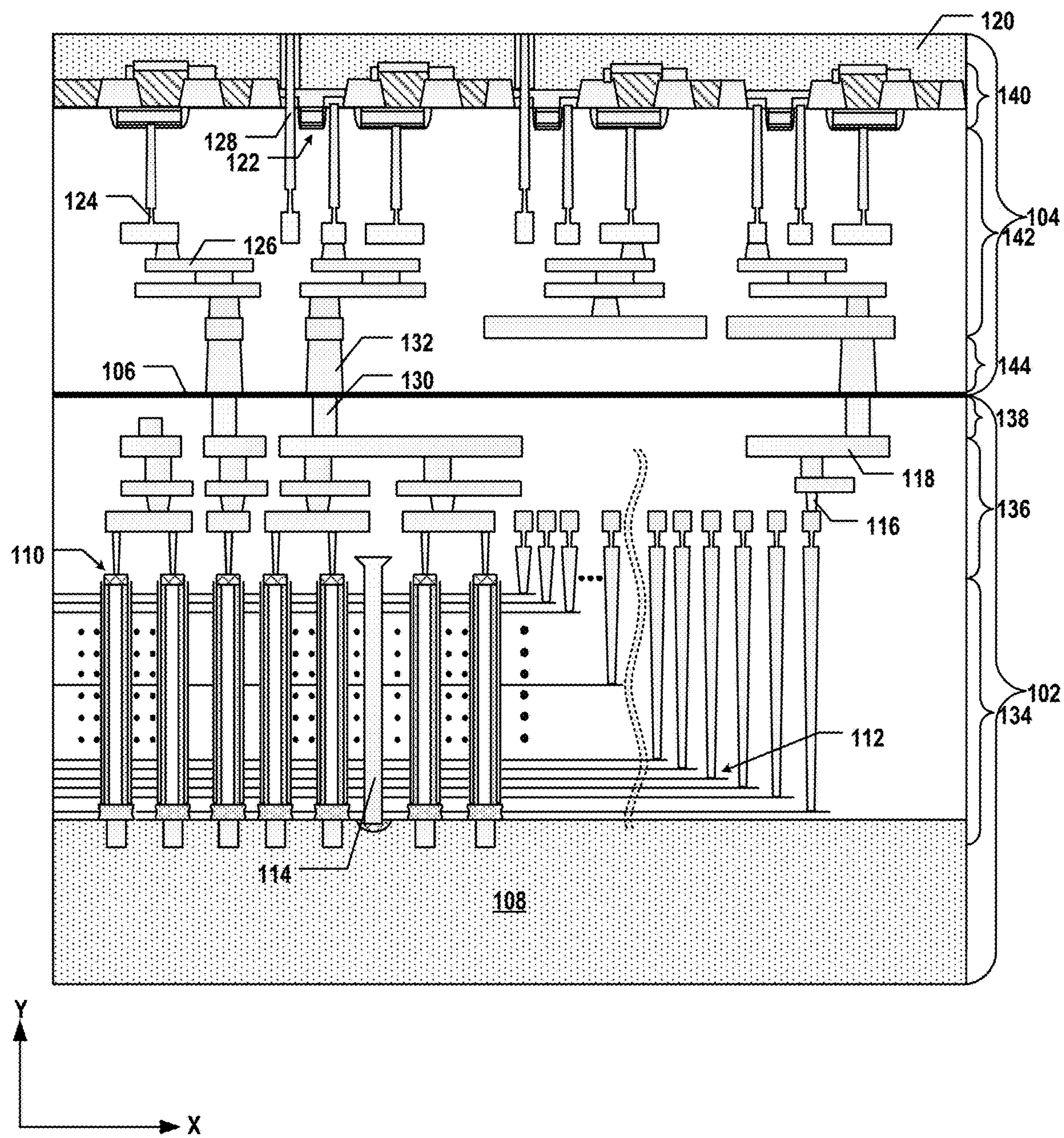
FIG. 1A illustrates a cross-section of an exemplary bonded semiconductor device, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

As used herein, the term "front surface" of a structure refers to the surface of the structure at which a device is formed or will be subsequently formed.

Plasma activation bonding is a direct wafer bonding method. Plasma activation bonding method includes surface activation using oxygen or inert gas plasma, surface cleaning using deionized water, followed by preliminary bonding, and finally a heat treatment to bond the two wafers. Plasma activation bonding relies on van der Waals forces and hydrogen bonding in the hydroxyl groups to achieve preliminary bonding prior to the heat treatment. During the heat treatment, water molecules are removed in condensation reactions to form covalent bonds between front surfaces of the first and second wafers to achieve a stabilized bonding. However, low hydroxyl content in deionized water used in the surface cleaning process may not be sufficient to achieve stable covalent bonding, causing wafer debonding in some cases.

Various embodiments in accordance with the present disclosure provide improved plasma activation bonding methods that can achieve stable and strong covalent bonding by increasing the amount of hydroxyl groups on the bonding surfaces of the wafers prior to the bonding. Water molecules can be ionized to form hydroxyl groups and bombarded onto the wafer bonding surface by a plasma activation process. As a result, wafer bonding methods disclosed herein can provide, among other things, benefits of (i) sufficient hydroxyl groups on bonding surfaces during the bonding process to improve wafer bonding strength; (ii) providing a larger process window for subsequent processes; (iii) improving device structure stability and reliability to streamline fabrication process; and (iv) reducing production cost and improving device quality.

FIG. 1A illustrates a cross-section of an exemplary bonded semiconductor device 100, according to some embodiments of the present disclosure. Bonded semiconductor device 100 represents an example of a non-monolithic 3D memory device. The term "non-monolithic" means that the components of bonded semiconductor device 100 (e.g., peripheral devices and memory array devices) can be formed separately on different substrates and then bonded to form a bonded semiconductor device. Bonded semiconductor device 100 can include a substrate 108, which can include silicon (e.g., single crystalline silicon), silicon germanium (SiGe), gallium arsenide (GaAs), germanium (Ge), silicon on insulator (SOI), or any other suitable materials. For ease of description, bonded semiconductor device 100 will be described as a non-monolithic 3D memory device. However, it is understood that bonded semiconductor device 100 is not limited to a 3D memory device and can include any suitable semiconductor devices that have stable and strong covalent bonds at its bonding interface using the plasma activation bonding methods described below in detail. It is understood that bonded semiconductor devices formed using the plasma activation bonding methods disclosed herein are not limited to the examples shown in FIGS. 1A-1B and can include any other suitable semiconductor devices, such as logic devices (e.g., central processing unit (CPU) and graphical processing unit (GPU)), volatile memory devices (e.g., dynamic random-access memory (DRAM) and static random-access memory (SRAM)), and non-volatile memory devices (e.g., Flash memory), in a 2D, 2.5D, or 3D architecture.

Bonded semiconductor device 100 can include two semiconductor structures (referred to herein as "wafers" as well), i.e., a memory array device chip 102 (a first wafer) and a peripheral device chip 104 (a second wafer) bonded on top of memory array device chip 102 in a face-to-face manner at a bonding interface 106. In some embodiments, bonding interface 106 is disposed between memory array device chip 102 and peripheral device chip 104 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some embodiments, bonding interface 106 is the place at which memory array device chip 102 and peripheral device chip 104 meet and are bonded. In practice, bonding interface 106 can be a layer with a certain thickness that includes the top surface of memory array device chip 102 and the bottom surface of peripheral device chip 104.

It is noted that x and y axes are included in FIG. 1A to further illustrate the spatial relationship of the components in bonded semiconductor device 100 having substrate 108. Substrate 108 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a semiconductor device (e.g., bonded semiconductor device 100) is determined relative to the substrate of the semiconductor device (e.g., substrate 108) in the y-direction (i.e., the vertical direction) when the substrate is positioned in the lowest plane of the semiconductor device in the y-direction. The same notion for describing spatial relationship is applied throughout the present disclosure.

In some embodiments, memory array device chip 102 is a NAND Flash memory device in which memory cells are provided in the form of an array of NAND memory strings 110 in a memory array device layer 134. Memory array device layer 134 can be disposed on substrate 108. In some embodiments, each NAND memory string 110 extends vertically through a plurality of pairs each including a conductor layer and a dielectric layer (referred to herein as "conductor/dielectric layer pairs"). The stacked conductor/dielectric layer pairs are collectively referred to herein as a "memory stack" 112 in memory array device layer 134. The conductor layers and dielectric layers in memory stack 112 can stack alternatingly in the vertical direction. Each NAND memory string 110 can include a semiconductor channel and a composite dielectric layer (also known as a "memory film") including a tunneling layer, a storage layer (also known as a "charge trap/storage layer"), and a blocking layer (not shown). In some embodiments, memory array device layer 134 further includes a gate line slit ("GLS") 114 that extends vertically through memory stack 112. GLS 114 can be used to form the conductor/dielectric layer pairs in memory stack 112 by a gate replacement process and can be filled with conductive materials for electrically connecting an array common source (ACS).

In some embodiments, memory array device chip 102 also includes an array interconnect layer 136 above memory array device layer 134 for transferring electrical signals to and from NAND memory strings 110. As shown in FIG. 1A, array interconnect layer 136 can include a plurality of interconnects (also referred to herein as "contacts"), including vertical interconnect access (via) contacts 116 and lateral interconnect lines 118. As used herein, the term "interconnects" can broadly include any suitable types of interconnects, such as middle-end-of-line (MEOL) interconnects and back-end-of-line (BEOL) interconnects. Array interconnect layer 136 can further include one or more interlayer dielectric (ILD) layers (also known as "intermetal dielectric (IMD) layers") in which interconnect lines 118 and via contacts 116 can form.

As shown in FIG. 1A, memory array device chip 102 can further include a bonding layer 138 at bonding interface 106 and above array interconnect layer 136 and memory array device layer 134. Bonding layer 138 can include a plurality of bonding contacts 130 and dielectrics electrically isolating bonding contacts 130. Bonding contacts 130 can include conductive materials including, but not limited to, tungsten (W), cobalt (Co), copper (Cu), aluminum (Al), silicides, or any combination thereof. The remaining area of bonding layer 138 can be formed with dielectrics including, but not limited to, silicon oxide, silicon nitride, silicon oxynitride, low-k dielectrics, or any combination thereof. Bonding contacts 130 and surrounding dielectrics in bonding layer 138 can be used for hybrid bonding.

Peripheral device chip 104 can include a plurality of transistors 122 in a peripheral device layer 140 disposed below a semiconductor layer 120, such as a thinned substrate. In some embodiments, peripheral device layer 140 can include any suitable digital, analog, and/or mixed-signal peripheral circuits used for facilitating the operation of bonded semiconductor device 100. For example, peripheral device layer 140 can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors).

Similar to memory array device chip 102, peripheral device chip 104 can also include a peripheral interconnect layer 142 disposed below peripheral device layer 140 for transferring electrical signals to and from transistors 122. Peripheral interconnect layer 142 can include a plurality of interconnects, including interconnect lines 126 and via contacts 124 in one or more ILD layers. In some embodiments, peripheral device chip 104 also includes via contacts 128 (e.g., through silicon vias (TSVs) if semiconductor layer 120 is a thinned silicon substrate) extending vertically through semiconductor layer 120. In some embodiments, peripheral device chip 104 further includes a BEOL interconnect layer (not shown) above transistors 122 and semiconductor layer 120. In some embodiments, the BEOL interconnect layer includes any suitable BEOL interconnects and contact pads that can transfer electrical signals between bonded semiconductor device 100 and external circuits.

As shown in FIG. 1A, peripheral device chip 104 can further include a bonding layer 144 at bonding interface 106 and below peripheral interconnect layer 142 and peripheral device layer 140. Bonding layer 144 can include a plurality of bonding contacts 132 and dielectrics electrically isolating bonding contacts 132. Bonding contacts 132 can include conductive materials including, but not limited to, W, Co, Cu, Al, silicides, or any combination thereof. The remaining area of bonding layer 144 can be formed with dielectrics including, but not limited to, silicon oxide, silicon nitride, silicon oxynitride, low-k dielectrics, or any combination thereof. Bonding contacts 132 and surrounding dielectrics in bonding layer 144 can be used for hybrid bonding.

Figure 1B:
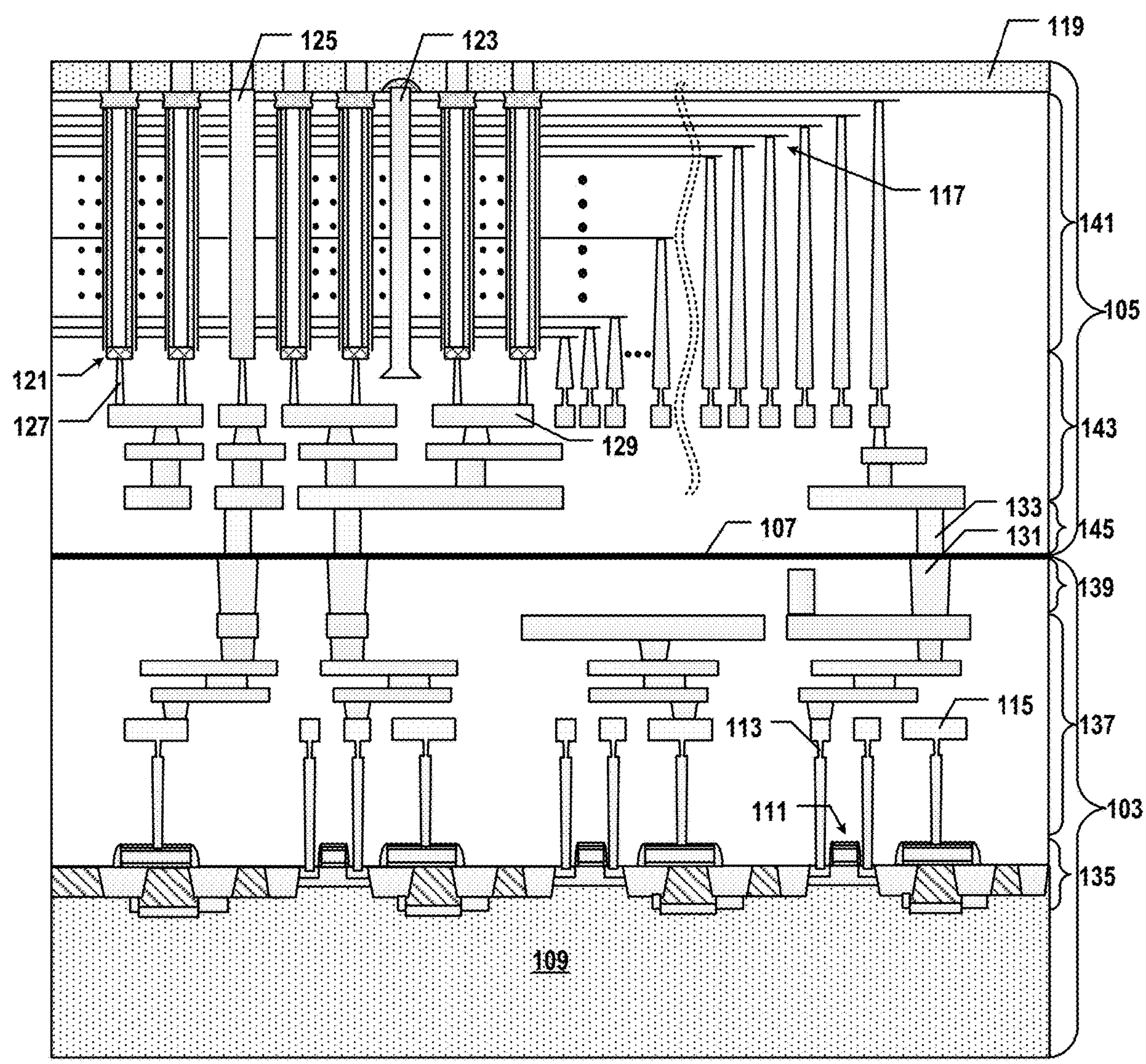
FIG. 1B illustrates a cross-section of another exemplary bonded semiconductor device, according to some embodiments of the present disclosure.

FIG. 1B illustrates a cross-section of another exemplary bonded semiconductor device 101, according to some embodiments of the present disclosure. Similar to bonded semiconductor device 100 described above in FIG. 1A, bonded semiconductor device 101 represents an example of a non-monolithic 3D memory device in which two semiconductor structures, i.e., a peripheral device chip 103 (a first wafer) and a memory array device chip 105 (a second wafer) are formed separately and bonded in a face-to-face manner at a bonding interface 107. In some embodiments, bonding interface 107 is the place at which memory array device chip 105 and peripheral device chip 103 meet and are bonded. In practice, bonding interface 107 can be a layer with a certain thickness that includes the top surface of peripheral device chip 103 and the bottom surface of memory array device chip 105. Different from bonded semiconductor device 100 described above in FIG. 1A in which peripheral device chip 104 is above memory array device chip 102, bonded semiconductor device 101 in FIG. 1B includes peripheral device chip 103 disposed below memory array device chip 105. It is understood that the details of similar structures (e.g., materials, fabrication process, functions, etc.) in both bonded semiconductor devices 100 and 101 may not be repeated below.

Peripheral device chip 103 can include a plurality of transistors 111 in a peripheral device layer 135 disposed on and/or in a substrate 109. In some embodiments, peripheral device layer 135 can include any suitable digital, analog, and/or mixed-signal peripheral circuits used for facilitating the operation of bonded semiconductor device 101. For example, peripheral device layer 135 can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors). Peripheral device chip 103 can also include a peripheral interconnect layer 137 above peripheral device layer 135 for transferring electrical signals to and from transistors 111. Peripheral interconnect layer 137 can include a plurality of interconnects, including interconnect lines 115 and via contacts 113 in one or more ILD layers. As shown in FIG. 1B, peripheral device chip 103 further includes a bonding layer 139 at bonding interface 107 and above peripheral interconnect layer 137 and peripheral device layer 135. Bonding layer 139 can include a plurality of bonding contacts 131 and dielectrics electrically isolating bonding contacts 131.

In some embodiments, memory array device chip 105 is a NAND Flash memory device in which memory cells are provided in the form of an array of NAND memory strings 121 in a memory array device layer 141 disposed below a semiconductor layer 119 (e.g., a thinned substrate). In some embodiments, each NAND memory string 121 extends vertically through a memory stack 117 in memory array device layer 141. Each NAND memory string 121 can include a semiconductor channel and a composite dielectric layer (also known as a "memory film") including a tunneling layer, a storage layer (also known as a "charge trap/storage layer"), and a blocking layer (not shown). In some embodiments, memory array device chip 105 further includes a GLS 123 that extends vertically through memory stack 117. GLS 123 can be used to form the conductor/dielectric layer pairs in memory stack 117 by a gate replacement process and can be filled with conductive materials for electrically connecting an array common source ACS.

Memory array device chip 105 can also include an array interconnect layer 143 below memory array device layer 141 for transferring electrical signals to and from NAND memory strings 121. Array interconnect layer 143 can include a plurality of interconnects, including interconnect lines 129 and via contacts 127 in one or more ILD layers. Memory array device chip 105 can also include semiconductor layer 119 and a BEOL interconnect layer (not shown) above NAND memory strings 121. In some embodiments, the BEOL interconnect layer includes any suitable BEOL interconnects and contact pads that can transfer electrical signals between bonded semiconductor device 101 and external circuits. In some embodiments, memory array device chip 105 further includes one or more through array contacts (TACs) 125 that extend vertically through the entirety of memory stack 117 and at least part of semiconductor layer 119. The upper end of TAC 125 can contact an interconnect in the BEOL interconnect layer (not shown), and the lower end of TAC 125 can contact another interconnect 127 or 129 in array interconnect layer 143. TAC 125 can thus make an electrical connection between peripheral interconnect layer 137 and the BEOL interconnect layer and carry electrical signals from peripheral device chip 103 to the BEOL interconnects of bonded semiconductor device 101. As shown in FIG. 1B, memory array device chip 105 can further include a bonding layer 145 at bonding interface 107 and below array interconnect layer 143 and memory array device layer 141. Bonding layer 145 can include a plurality of bonding contacts 133 and dielectrics electrically isolating bonding contacts 133.

Figure 4:
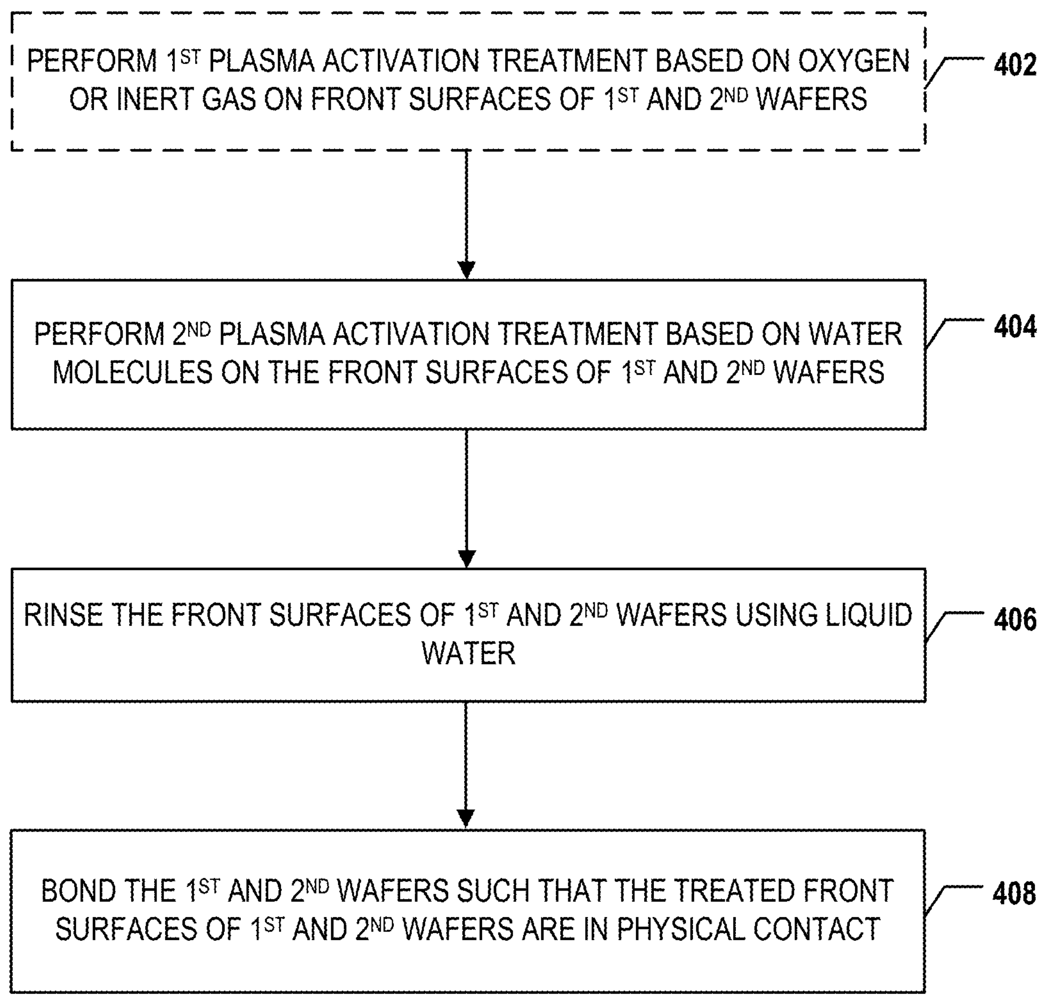
FIG. 4 is a flowchart of an exemplary method for wafer bonding, according to some embodiments of the present disclosure.

FIGS. 2A-2D illustrate an exemplary fabrication process for wafer bonding, according to some embodiments of the present disclosure. FIG. 4 is a flowchart of an exemplary method 400 for wafer bonding, according to some embodiments of the present disclosure. FIGS. 2A-2D and 4 will be described together. It is understood that the operations shown in method 400 are not exhaustive and that other operations can be performed as well before, after, or between any of the illustrated operations. Further, some of the operations may be performed simultaneously, or in a different order than shown in FIG. 4.

Referring to FIG. 4, method 400 starts at operation 402, in which a first plasma activation treatment is performed based on oxygen or an inert gas on a front surface of a first wafer and a front surface of a second wafer. In some embodiments, the inert gas includes nitrogen, argon, any other suitable inert gas, or any combination thereof. Each of the first wafer and second wafer can include silicon. That is, each of the first and second wafers is a silicon wafer, according to some embodiments. The first plasma activation treatment is also known as a surface activation process that can break the bonds of silicon oxide molecules formed by native oxidation or thermal oxidation on the front surfaces of silicon wafers.

Figure 2A:
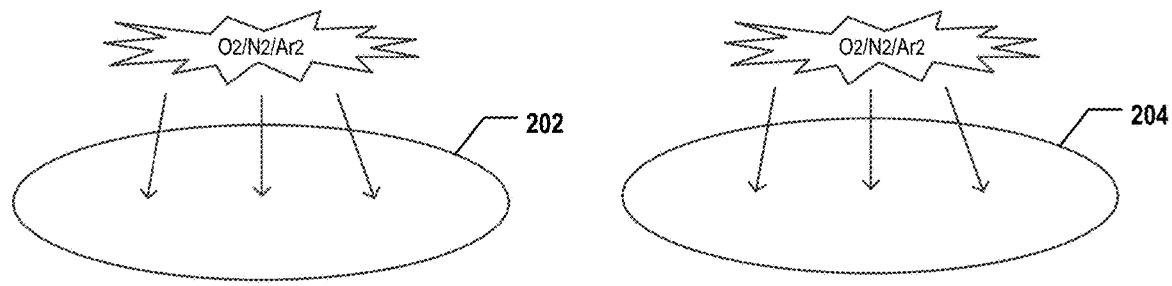
FIGS. 2A-2D illustrate an exemplary fabrication process for wafer bonding, according to some embodiments of the present disclosure.

As illustrated in FIG. 2A, the first plasma activation treatment is performed on the front surfaces of a first wafer 202 and a second wafer 204. In some embodiments, at least one of first and second wafers 202 and 204 includes a device formed on the front surface, i.e., not a bare wafer. In one example, first wafer 202 and second wafer 204 can be memory array device chip 102 and peripheral device chip 104 illustrated in FIG. 1A, respectively. In another example, first wafer 202 and second wafer 204 can be peripheral device chip 103 and memory array device chip 105 illustrated in FIG. 1B, respectively. It is understood that one or both of first and second wafers 202 and 204 can be bare wafers without any device formed thereon. In some embodiments, first wafer 202 and second wafer 204 can include silicon, germanium, an III-V semiconductor, silicon carbide, silicon on insulating substrate, or any suitable combination thereof.

In some embodiments, at least part of the front surface of first wafer 202 and at least part of the front surface of second wafer 204 include a dielectric layer of oxides, nitrides, carbides, or a combination thereof. For example, each of first and second wafers 202 and 204 can be a silicon wafer that includes silicon, and the front surfaces of first and second wafers 202 and 204 can include silicon oxide, silicon nitride, or a nitrogen-doped silicon carbide. Fabrication methods to form the dielectric layer include, but not limited to, lithography, etching, deposition, thermal oxidation, filling, polishing, or a combination thereof. In some embodiments, in preparation for wafer bonding prior to subsequent first plasma activation treatment, at least part of the front surfaces of first and second wafers 202 and 204 is formed with silicon oxide, and then planarized using, for example, a chemical-mechanical polishing (CMP) technique. In some embodiments, the first and second wafers 202 and 204 to be bonded are not limited to those with extrinsically deposited silicon oxide layers, but can also include surfaces having intrinsic silicon oxide, such as glass substrates or native oxide layers.

Plasma activation (also known as "plasma functionalization") is a method of surface modification employing plasma processing, which can modify the chemical and/or physical properties of the surface of a wafer. In some embodiments, plasma gases used by the first plasma activation treatment include, but not limited to, oxygen ($O_2$), an inert gas (e.g., nitrogen ($N_2$) or argon ($Ar_2$)), or a combination thereof. In one example, the plasma gas can be oxygen. In another example, the plasma gas can be nitrogen. The plasma gas can further include other suitable gases, such as hydrogen ($H_2$). Concentration of plasma gases is less than about 5%, such as less than 5%, according to some embodiments. In some embodiments, the first plasma activation treatment is performed with a pressure between about 0.05 mbar and about 0.5 mbar, such as between 0.05 mbar and 0.5 mbar. The first plasma activation treatment can be performed with a discharge power between about 10 watts and about 100 watts, such as between 10 watts and 100 watts. In some embodiments, the first plasma activation treatment is performed with a high frequency discharge power between about 40 watts and about 100 watts, such as between 40 watts and 100 watts. In some embodiments, the first plasma activation treatment is performed with a low frequency discharge power between about 10 watts and about 40 watts, such as between 10 watts and 40 watts. In some embodiments, the first plasma activation treatment is performed for a duration between about 5 seconds and about 50 seconds, such as between 5 seconds and 50 seconds. In some embodiments, the first plasma activation treatment is performed with a flow rate between about 30 standard cubic centimeters per minute (sccm) and about 80 sccm, such as between 30 sccm and 80 sccm. In some embodiments, a chemical activation treatment is also be performed.

Method 400 proceeds to operation 404, as illustrated in FIG. 4, in which, after the first plasma activation treatment, a second plasma activation treatment based on water molecules is performed on the front surface of the first wafer and the front surface of the second wafer. Different from the first plasma activation treatment in which the plasma gas is oxygen or an inert gas, the plasma gas used by the second plasma activation includes water vapor, according to some embodiments. The water vapor can be ionized by the plasma processing to become hydroxyl groups, which can be bombarded onto the front surfaces of the first and second wafers. In some embodiments in which the first and second wafers include silicon, the hydroxyl groups are bonded on the silicon to form silanol groups on the front surfaces (i.e., bonding surfaces). The plasma processing can facilitate the formation of the silanol groups as well. As an operation dedicated for forming hydroxyl groups on the bonding surfaces, the second plasma activation treatment does not use oxygen or an inert gas as the plasma gas, according to some embodiments.

Figure 2B:
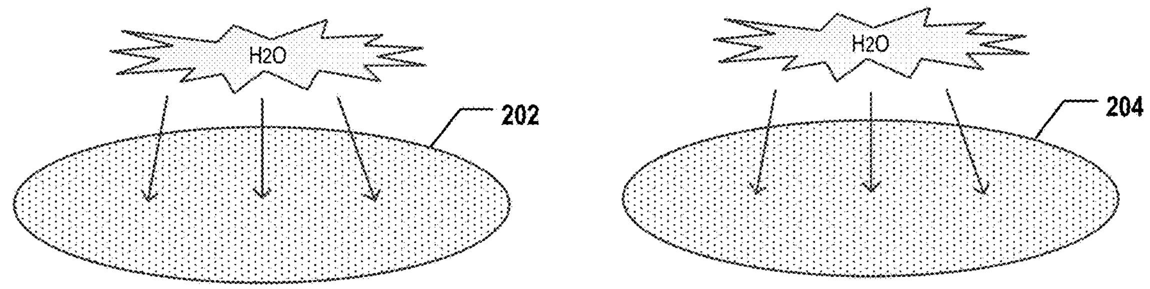
Figure 5:
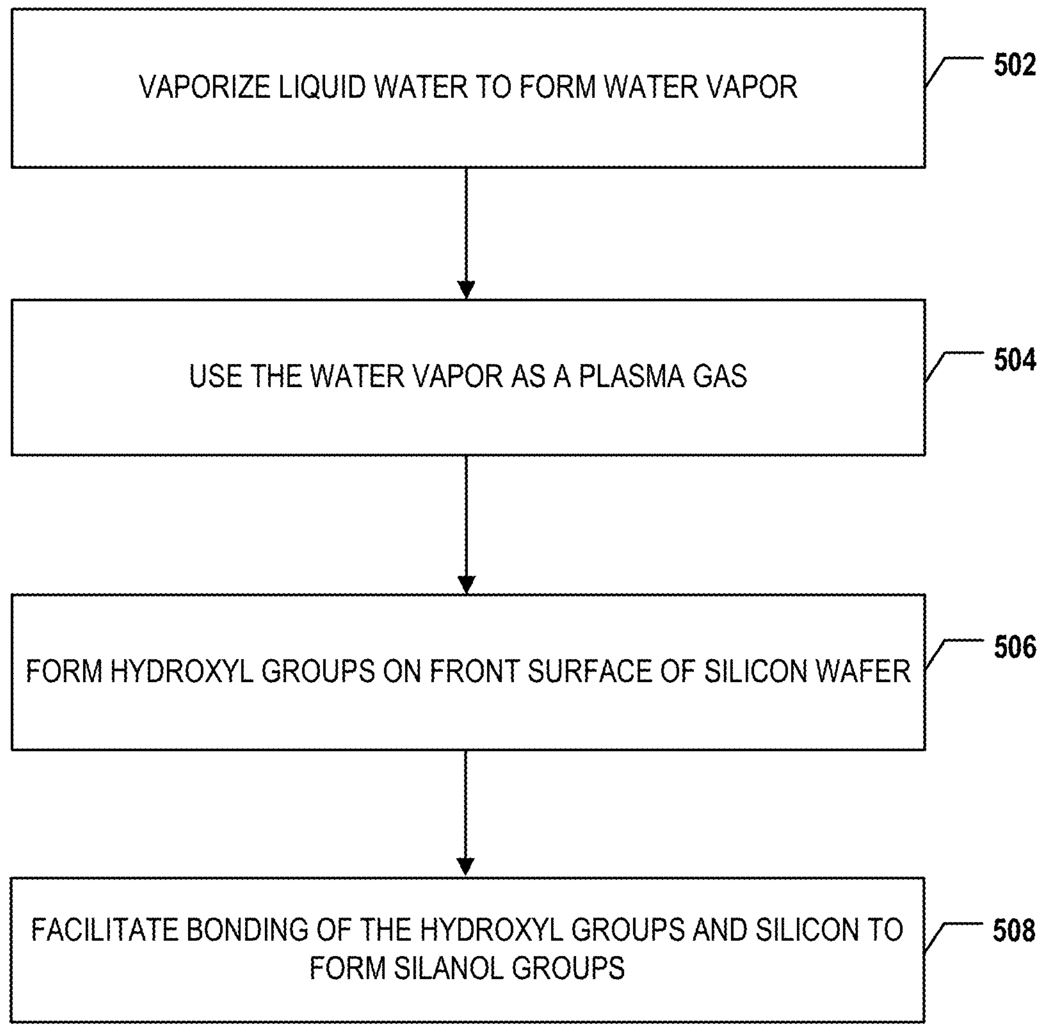
FIG. 5 is a flowchart of an exemplary method for a plasma activation treatment based on water molecules, according to some embodiments of the present disclosure.

As illustrated in FIG. 2B, the second plasma activation treatment based on water molecules ($H_2O$) is performed on the front surface of first wafer 202 and the front surface of second wafer 204. Hydroxyl groups can be formed on the front surfaces of first and second wafers 202 and 204 by the second plasma activation treatment. For example, FIG. 5 is a flowchart of an exemplary method 500 for a plasma activation treatment based on water molecules, according to some embodiments of the present disclosure. It is understood that the operations shown in method 500 are not exhaustive and that other operations can be performed as well before, after, or between any of the illustrated operations. Further, some of the operations may be performed simultaneously, or in a different order than shown in FIG. 5.

Starting at operation 502, liquid water is vaporized to form water vapor. Water vapor can be produced from the evaporation or boiling of liquid water. At operation 504, the water vapor is used as the plasma gas for the second plasma activation treatment. In some embodiments, water vapor is supplied to the plasma chamber and ionized in the plasma chamber under the conditions described below in detail to form hydroxyl groups (—OH). The ionization of water molecules in water vapor by plasma can be described as following:

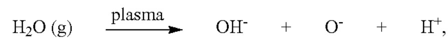

$$H_2O\,(g) \xrightarrow{\text{plasma}} OH^- + O^- + H^+,$$

where water molecules in the gaseous phase are ionized by plasma to become hydroxyl groups, oxygen ions, and hydrogen ions.

The second plasma activation treatment can be performed with a discharge power between about 10 watts and about 100 watts, such as between 10 watts and 100 watts (e.g., 10 watts, 20 watts, 30 watts, 40 watts, 50 watts, 60 watts, 70 watts, 80 watts, 90 watts, 100 watts, any range bounded by the lower end by any of these values, or any range defined by any two of these values). In some embodiments, the second plasma activation treatment is performed with a high frequency discharge power between about 40 watts and about 100 watts, such as between 40 watts and 100 watts (e.g., 40 watts, 45 watts, 50 watts, 55 watts, 60 watts, 65 watts, 70 watts, 75 watts, 80 watts, 85 watts, 90 watts, 95 watts, 100 watts, any range bounded by the lower end by any of these values, or any range defined by any two of these values). In some embodiments, the second plasma activation treatment is performed with a low frequency discharge power between about 10 watts and about 40 watts, such as between 10 watts and 40 watts (e.g., 10 watts, 15 watts, 20 watts, 25 watts, 30 watts, 35 watts, 40 watts, any range bounded by the lower end by any of these values, or any range defined by any two of these values).

In some embodiments, the second plasma activation treatment is performed with a pressure between about 0.05 mbar and about 0.5 mbar, such as between 0.05 mbar and 0.5 mbar (e.g., 0.05 mbar, 0.06 mbar, 0.07 mbar, 0.08 mbar, 0.09 mbar, 0.1 mbar, 0.2 mbar, 0.3 mbar, 0.4 mbar, 0.5 mbar, any range bounded by the lower end by any of these values, or any range defined by any two of these values). In some embodiments, the second plasma activation treatment is performed for a duration between about 5 seconds and about 50 seconds, such as between 5 seconds and 50 seconds (e.g., 5 seconds, 10 seconds, 15 seconds, 20 seconds, 25 seconds, 30 seconds, 35 seconds, 40 seconds, 45 seconds, 50 seconds, any range bounded by the lower end by any of these values, or any range defined by any two of these values). In some embodiments, the second plasma activation treatment is performed with a flow rate between about 30 sccm and about 80 sccm, such as between 30 sccm and 80 sccm (e.g., 30 sccm, 40 sccm, 50 sccm, 60 sccm, 70 sccm, 80 sccm, any range bounded by the lower end by any of these values, or any range defined by any two of these values).

In some embodiments, the processing conditions of the first and second plasma activation treatments are nominally the same except for the different plasma gases. For example, at least one of a pressure, a discharge power, or a duration of the first plasma activation treatment is the same as a respective one of a pressure, a discharge power, or a duration of the second plasma activation treatment.

Figure 3:
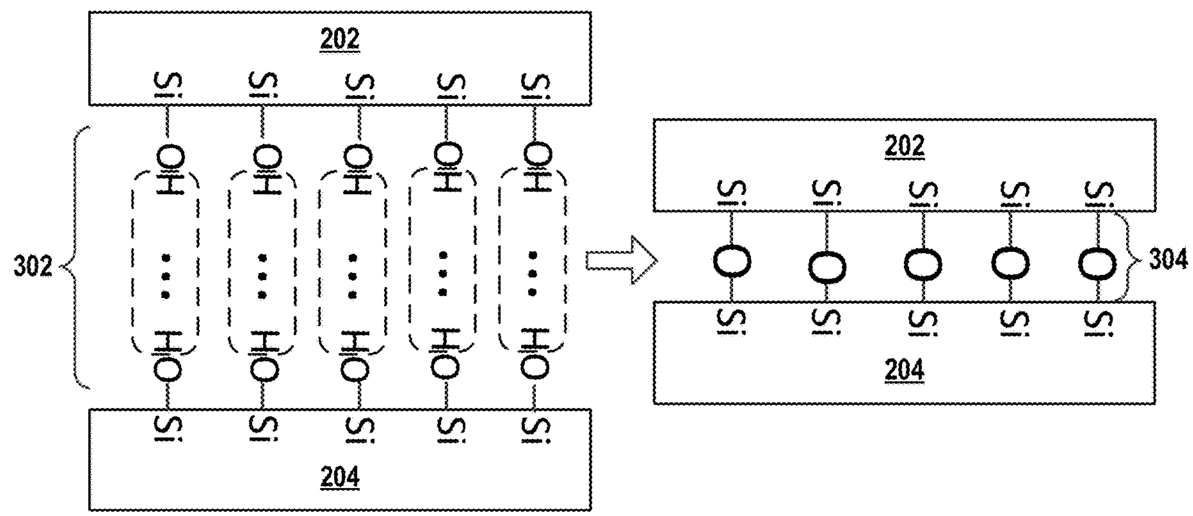
FIG. 3 illustrates an exemplary surface modification for wafer bonding, according to some embodiments of the present disclosure.

At operation 506, the hydroxyl groups ionized from the water vapor are formed on the front surfaces of first and second wafers 202 and 204 (e.g., silicon wafers) by the second plasma activation treatment. The hydroxyl groups are bombarded onto the front surfaces of first and second wafers 202 and 204 by the plasma processing, according to some embodiments. For example, as illustrated in FIG. 3, layers of hydroxyl groups 302 ionized from the water vapor are formed on the front surface of first silicon wafer 202 and the front surface of second silicon wafer 204. Referring back to FIG. 5, at operation 508, bonding of hydroxyl groups and silicon is facilitated by the second plasma activation treatment to form silanol groups (Si—OH). For example, as illustrated in FIG. 3, hydroxyl groups 302 on the front surfaces of first and second silicon wafers 202 and 204 can bond on silicon atoms by ionic bonds to form silanol groups. The plasma processing also facilitates the formation of silanol groups, for example, by increasing the amount of hydroxyl groups 302 bonded on silicon atoms, according to some embodiments.

Referring back to FIG. 4, in some embodiments, operation 402 is optional and can be skipped. That is, only one plasma activation treatment is performed on the front surfaces of the first and second wafers, which is based on water molecules, according to some embodiments. In some embodiments, operation 404 is performed on the front surfaces of the first and second wafers, which are free from another plasma activation treatment based on oxygen or an inert gas, e.g., operation 402. In one example, the single plasma activation treatment can use water vapor as the plasma gas without oxygen or an inert gas. In another example, the single plasma activation treatment can use water vapor as well as at least one of oxygen or an inert gas as the mixed plasma gases. The processing conditions of the single plasma activation treatment are nominally the same as those of the second plasma activation treatment described above, according to some embodiments, which are not repeated.

Figure 2C:
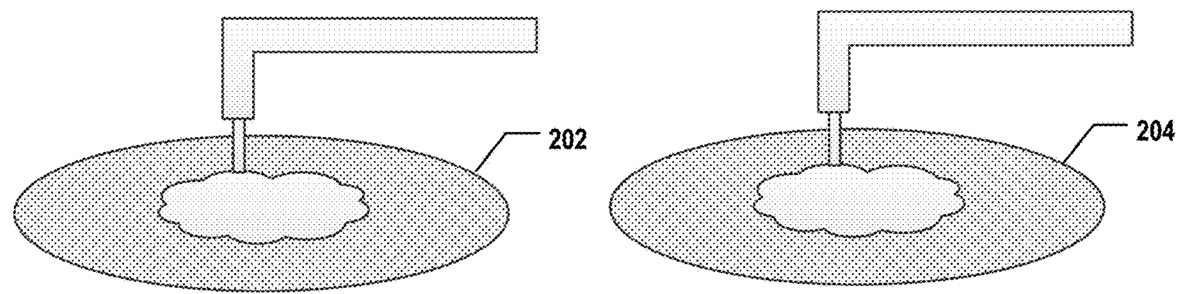

Method 400 proceeds to operation 406, as illustrated in FIG. 4, in which, after the second plasma activation treatment, the front surface of the first wafer and the front surface of the second wafer are rinsed using liquid water. As illustrated in FIG. 2C, the front surfaces of first and second wafers 202 and 204 are rinsed using deionized water, which can clean the bonding surfaces prior to the bonding and further increase the amount of hydroxyl groups (from the free hydroxyl groups in the liquid water) on the bonding surfaces of first and second wafers 202 and 204. In some embodiments in which first and second wafers 202 and 204 are silicon wafers, after plasma activation treatment(s) and water rinsing, front surfaces of first and second silicon wafers 202 and 24 can be mainly terminated by silanol groups as shown in FIG. 3.

Method 400 proceeds to operation 408, as illustrated in FIG. 4, in which, after the water rinsing, the first wafer and the second wafer are bonded such that the treated front surface of the first wafer is in physical contact with the treated front surface of the second wafer. In some embodiments, the bonding includes hybrid bonding. For hybrid bonding, silanol groups are not formed on the entire front surfaces of first and second wafers, but instead formed only on the dielectric layers (e.g., silicon oxide layers).

Figure 2D:
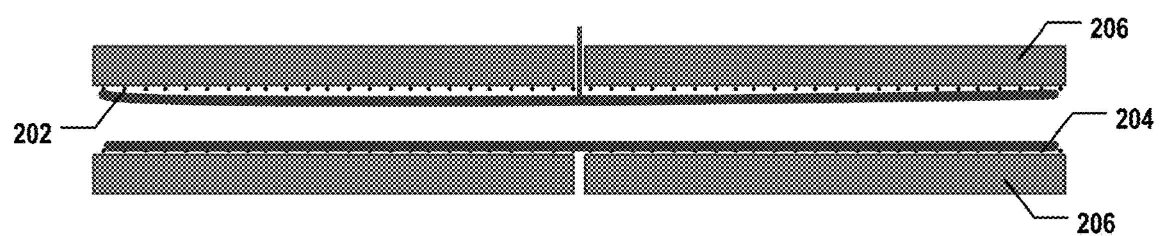

As illustrated in FIG. 2D, first wafer 202 is flipped upside down and held in a face-to-face manner toward second wafer 204 by a bond chuck 206. In some embodiments, mechanical locking mechanisms and/or vacuum suction are used to hold first and second wafers 202 and 204 in a face-to-face manner after alignment. An electric field is applied to first and second wafers 202 and 204 through electrodes in bond chuck 206, according to some embodiments. Pressure can be applied through bond chuck 206 to initiate the bonding process (e.g., as a preliminary bonding process). In some embodiments, the pressure brings the bonding surfaces of first and second wafers 202 and 204 into physical contact. As shown in FIG. 3, during this operation, van der Waals bonds and hydrogen bonds of hydroxyl groups 302 can be formed between the front surface of first silicon wafer 202 and the front surface of second silicon wafer 204, opposite to one another. A heat treatment process can then by applied through heating elements in bond chuck 206 on first and second silicon wafers 202 and 204. As shown in FIG. 3, a condensation reaction of silanol groups on the front surfaces of first and second wafers 202 and 204 can occur during the heat treatment, which results in formation of covalent Si—O—Si bonds 304 at the bonding interface between the front surfaces of first and second silicon wafers 202 and 204, thereby bonding first and second silicon wafers 202 and 204 together. In addition, the condensation reaction can also remove water molecules from the bonding interface. The condensation reaction can be described as following:

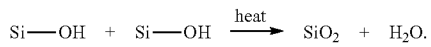

$$Si—OH + Si—OH \xrightarrow{heat} SiO_2 + H_2O.$$

In some embodiments, the heat treatment can include thermally annealing first and second wafers 202 and 204 under nitrogen atmosphere, with an annealing temperature between about 200° C. and about 450° C., such as between 200° C. and 450° C. In some embodiments, the heat treatment duration is between about 1 hour and about 2 hours, such as between 1 hour and 2 hours.

According to one aspect of the present disclosure, a method for wafer bonding is disclosed. A first plasma activation treatment based on oxygen or an inert gas is performed on a front surface of a first wafer and a front surface of a second wafer. After the first plasma activation treatment, a second plasma activation treatment based on water molecules is performed on the front surface of the first wafer and the front surface of the second wafer. After the second plasma activation treatment, the first wafer and the second wafer are bonded such that the treated front surface of the first wafer is in physical contact with the treated front surface of the second wafer.

In some embodiments, after the second plasma activation treatment and prior to the bonding, the treated front surface of the first wafer and the treated front surface of the second wafer are rinsed using liquid water.

In some embodiments, to perform the second plasma activation treatment, liquid water is vaporized to form water vapor, and the water vapor is used as a plasma gas.

In some embodiments, the second plasma activation treatment is performed with a pressure between about 0.05 mbar and about 0.5 mbar. In some embodiments, the second plasma activation treatment is performed with a discharge power between about 10 watts and about 100 watts. In some embodiments, the second plasma activation treatment is performed for a duration between about 5 seconds and about 50 seconds.

In some embodiments, at least one of a pressure, a discharge power, or a duration of the first plasma activation treatment is the same as a respective one of a pressure, a discharge power, or a duration of the second plasma activation treatment.

In some embodiments, the bonding includes hybrid bonding.

In some embodiments, hydroxyl groups are formed on the front surface of the first wafer and the front surface of the second wafer by the second plasma activation treatment. Each of the first and second wafers includes silicon, and the hydroxyl groups are bonded on the silicon to form silanol groups, according to some embodiments. In some embodiments, the second plasma activation treatment facilitates the bonding between the hydroxyl groups and the silicon.

According to another aspect of the present disclosure, a method for wafer bonding is disclosed. A plasma activation treatment based on water molecules is performed on a front surface of a first wafer and a front surface of a second wafer. The front surface of the first wafer and the front surface of the second wafer are free from another plasma activation treatment based on oxygen or an inert gas. After the plasma activation treatment, the first wafer and the second wafer are bonded such that the treated front surface of the first wafer is in physical contact with the treated front surface of the second wafer.

In some embodiments, after the plasma activation treatment and prior to the bonding, the treated front surface of the first wafer and the treated front surface of the second wafer are rinsed using liquid water.

In some embodiments, to perform the plasma activation treatment, liquid water is vaporized to form water vapor, and the water vapor is used as a plasma gas.

In some embodiments, the plasma activation treatment is performed with a pressure between about 0.05 mbar and about 0.5 mbar. In some embodiments, the plasma activation treatment is performed with a discharge power between about 10 watts and about 100 watts. In some embodiments, the plasma activation treatment is performed for a duration between about 5 seconds and about 50 seconds.

In some embodiments, the bonding includes hybrid bonding.

In some embodiments, hydroxyl groups are formed on the front surface of the first wafer and the front surface of the second wafer by the plasma activation treatment. Each of the first and second wafers includes silicon, and the hydroxyl groups are bonded on the silicon to form silanol groups, according to some embodiments. In some embodiments, the plasma activation treatment facilitates the bonding between the hydroxyl groups and the silicon.

According to still another aspect of the present disclosure, a method for wafer bonding is disclosed. A plasma activation treatment is performed on a front surface of a first silicon wafer and a front surface of a second silicon wafer to form hydroxyl groups on the front surface of the first silicon wafer and the front surface of the second silicon wafer. After the plasma activation treatment, the first silicon wafer and the second silicon wafer are bonded such that the treated front surface of the first silicon wafer is in physical contact with the treated front surface of the second silicon wafer.

In some embodiments, the hydroxyl groups are bonded on silicon to form silanol groups. In some embodiments, the plasma activation treatment facilitates the bonding between the hydroxyl groups and the silicon.

In some embodiments, to perform the plasma activation treatment, liquid water is vaporized to form water vapor, and the water vapor is used as a plasma gas.

In some embodiments, prior to performing the plasma activation treatment, another plasma activation treatment is performed based on oxygen or an inert gas on the front surface of the first silicon wafer and the front surface of the second silicon wafer.

In some embodiments, the front surface of the first silicon wafer and the front surface of the second silicon wafer are free from another plasma activation treatment based on oxygen or an inert gas.

In some embodiments, after the plasma activation treatment and prior to the bonding, the treated front surface of the first silicon wafer and the treated front surface of the second silicon wafer are rinsed using liquid water.

In some embodiments, the bonding includes hybrid bonding.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for wafer bonding, comprising:

performing a first plasma activation treatment based on oxygen or an inert gas on a front surface of a first wafer and a front surface of a second wafer;

after the first plasma activation treatment, performing a second plasma activation treatment based on water molecules on the front surface of the first wafer and the front surface of the second wafer;

after the second plasma activation treatment, rinsing the treated front surface of the first wafer and the treated front surface of the second wafer using liquid water; and after the rinsing the treated front surface of the first wafer and the treated front surface of the second wafer using the liquid water, bonding the first wafer and the second wafer such that the treated front surface of the first wafer is in physical contact with the treated front surface of the second wafer.

2. The method of claim 1, wherein performing the second plasma activation treatment comprises:

vaporizing liquid water to form water vapor; and using the water vapor as a plasma gas.

3. The method of claim 1, wherein the second plasma activation treatment is performed with a pressure between about 0.05 mbar and about 0.5 mbar.

4. The method of claim 1, wherein the second plasma activation treatment is performed with a discharge power between about 10 watts and about 100 watts.

5. The method of claim 1, wherein the second plasma activation treatment is performed for a duration between about 5 seconds and about 50 seconds.

6. The method of claim 1, wherein at least one of a pressure, a discharge power, or a duration of the first plasma activation treatment is the same as a respective one of a pressure, a discharge power, or a duration of the second plasma activation treatment.

7. The method of claim 1, wherein the bonding includes hybrid bonding.

8. The method of claim 1, wherein hydroxyl groups are formed on the front surface of the first wafer and the front surface of the second wafer by the second plasma activation treatment.

9. The method of claim 8, wherein each of the first and second wafers comprises silicon; and the hydroxyl groups are bonded on the silicon to form silanol groups.

10. The method of claim 9, wherein the second plasma activation treatment facilitates the bonding between the hydroxyl groups and the silicon.

11. A method for wafer bonding, comprising:

performing a plasma activation treatment based on water molecules on a front surface of a first wafer and a front surface of a second wafer, the front surface of the first wafer and the front surface of the second wafer being free from another plasma activation treatment based on oxygen or an inert gas;

after the plasma activation treatment, rinsing the treated front surface of the first wafer and the treated front surface of the second wafer using liquid water; and after the rinsing the treated front surface of the first wafer and the treated front surface of the second wafer using the liquid water, bonding the first wafer and the second wafer such that the treated front surface of the first wafer is in physical contact with the treated front surface of the second wafer.

12. The method of claim 11, wherein performing the plasma activation treatment comprises:

vaporizing liquid water to form water vapor; and using the water vapor as a plasma gas.

13. The method of claim 11, wherein the plasma activation treatment is performed with a pressure between about 0.05 mbar and about 0.5 mbar.

14. The method of claim 11, wherein the plasma activation treatment is performed with a discharge power between about 10 watts and about 100 watts.

15. The method of claim 11, wherein the plasma activation treatment is performed for a duration between about 5 seconds and about 50 seconds.

16. The method of claim 11, wherein hydroxyl groups are formed on the front surface of the first wafer and the front surface of the second wafer by the plasma activation treatment.

17. The method of claim 16, wherein each of the first and second wafers comprises silicon; and the hydroxyl groups are bonded on the silicon to form silanol groups.

18. A method for wafer bonding, comprising:

performing a first plasma activation treatment based on oxygen or an inert gas on a front surface of a first silicon wafer and a front surface of a second silicon wafer;

after the first plasma activation treatment, performing a second plasma activation treatment on the front surface of the first silicon wafer and the front surface of the second silicon wafer to form hydroxyl groups on the front surface of the first silicon wafer and the front surface of the second silicon wafer; and after the second plasma activation treatment, bonding the first silicon wafer and the second silicon wafer such that the treated front surface of the first silicon wafer is in physical contact with the treated front surface of the second silicon wafer, wherein at least one of a pressure, a discharge power, or a duration of the first plasma activation treatment is the same as a respective one of a pressure, a discharge power, or a duration of the second plasma activation treatment.

19. The method of claim 18, further comprising, after the second plasma activation treatment and prior to the bonding, rinsing the treated front surface of the first silicon wafer and the treated front surface of the second silicon wafer using liquid water.

20. The method of claim 18, wherein performing the second plasma activation treatment comprises:

vaporizing liquid water to form water vapor; and using the water vapor as a plasma gas.

* * * * *